US009413300B2

(12) United States Patent
Uppathil et al.

(10) Patent No.: US 9,413,300 B2
(45) Date of Patent: Aug. 9, 2016

(54) FRONT-END MATCHING AMPLIFIER

(71) Applicant: Texas Instruments Incorporated, Dallas, TX (US)

(72) Inventors: Satish V. Uppathil, Allen, TX (US); Nikolaus Klemmer, Dallas, TX (US); Fikret Dulger, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/815,619

(22) Filed: Jul. 31, 2015

(65) Prior Publication Data

US 2016/0043697 A1     Feb. 11, 2016

Related U.S. Application Data

(60) Provisional application No. 62/033,417, filed on Aug. 5, 2014.

(51) Int. Cl.
*H03F 1/22* (2006.01)
*H04B 1/10* (2006.01)
*H04L 27/38* (2006.01)
*H03F 3/195* (2006.01)
*H03F 3/45* (2006.01)

(52) U.S. Cl.
CPC .............. *H03F 1/223* (2013.01); *H03F 3/195* (2013.01); *H03F 3/45179* (2013.01); *H03F 3/45242* (2013.01); *H04L 27/3809* (2013.01); *H03F 2200/72* (2013.01); *H03F 2200/75* (2013.01); *H03F 2203/45024* (2013.01); *H03F 2203/45306* (2013.01); *H03F 2203/45392* (2013.01); *H03F 2203/45481* (2013.01); *H03F 2203/45631* (2013.01)

(58) Field of Classification Search
CPC ..... H03F 1/223; H03F 1/56; H03F 2200/318; H03F 3/45179; H03F 3/211; H03F 2200/72; H03F 2200/75; H03F 2203/45062
See application file for complete search history.

(56) References Cited

U.S. PATENT DOCUMENTS

| | | | |
|---|---|---|---|
| 2003/0058045 A1* | 3/2003 | Taylor | H03G 3/3042 330/133 |
| 2003/0184388 A1* | 10/2003 | Wilson | H03F 3/082 330/308 |
| 2009/0153244 A1* | 6/2009 | Cabanillas | H03F 1/3205 330/253 |
| 2010/0237942 A1* | 9/2010 | Li | H03F 1/26 330/253 |
| 2011/0193635 A1* | 8/2011 | Zeng | H03F 1/0205 330/296 |
| 2011/0267144 A1* | 11/2011 | Behera | H03F 3/3081 330/260 |
| 2012/0206208 A1* | 8/2012 | Zeng | H03F 1/0205 330/310 |
| 2012/0322400 A1* | 12/2012 | Rentala | H03D 7/00 455/341 |

* cited by examiner

*Primary Examiner* — Aristocratis Fotakis
(74) *Attorney, Agent, or Firm* — Daniel Chan; Frank D. Cimino

(57) ABSTRACT

A front-end receiver includes an amplifier that has a steady gain over a wide frequency range. The disclosed amplifier adopts an architecture in which a common-source (CS) circuit stacks against a common-gate (CG) circuit. The CG circuit provides the input impedance matching while the CS circuit boosts the amplification gain. As a result, the disclosed amplifier allows the front-end receiver to break free from a tradeoff between input impedance matching and gain boosting. Moreover, the disclosed amplifier achieves power saving and noise reduction by having the CS circuit to share the same bias current with the CG circuit.

20 Claims, 5 Drawing Sheets

FRONT-END MATCHING AMPLIFIER

CROSS REFERENCE TO RELATED APPLICATIONS

Under 35 U.S.C. §119(e), this application claims the benefit of priority of U.S. Provisional Application 62/033,417 filed Aug. 5, 2014, which is hereby incorporated by reference in its entirety.

BACKGROUND

Broadband transceivers are commonly used in wireless base stations. Typically, a broadband transceiver has a wide transmission and reception frequency band, which may span from the hundred MHz range to the lower GHz range. To receive information carried by a particular channel, the broadband transceiver includes a front-end receiver that is capable of frequency tuning. The front-end receiver may include off-chip components and/or on-chip components to build a matching network for matching the impedance associated with a particular channel. However, these matching networks include large tuning components (e.g., inductors), which make it prohibitively expensive to implement on-chip and space inefficient to implement off-chip. Attempts have been made in the past to eliminate matching networks in front-end receivers by using amplifiers with impedance matching capabilities. These matching amplifiers, however, face a common tradeoff between amplification gain and input matching. Thus, there is a need for a front-end amplifier that has high amplification gain and good input matching characteristics.

SUMMARY

The present disclosure describes systems and structures of a front-end receiver for use in a broadband transceiver. The disclosed front-end receiver includes an amplifier that has a steady gain over a wide frequency range without using any matching network. The disclosed amplifier adopts an architecture in which a common-source (CS) circuit stacks against a common-gate (CG) circuit. The CG circuit provides the input impedance matching while the CS circuit boosts the amplification gain. As a result, the disclosed amplifier allows the front-end receiver to break free from the tradeoff between input impedance matching and gain boosting. Moreover, the disclosed amplifier achieves power saving and noise reduction by having the CS circuit to share the same bias current with the CG circuit.

In one implementation, the disclosed front-end receiver is incorporated in an integrated circuit having an input port and an amplifier. The input port is configured to receive a radio frequency (RF) signal. The amplifier is coupled with the input port. The amplifier includes a common-source (CS) circuit, a common-gate (CG) circuit, and an output lead. The CS circuit has a gate terminal coupled with the input port, the CS circuit defining a first transconductance based on a bias current. The CG circuit has a drain terminal coupled with the CS circuit and a source terminal coupled with the input port. The CG circuit defines a second transconductance based on the bias current such that the second transconductance is used for matching an input impedance associated with the RF signal. The output lead is coupled with the CS circuit and the CG circuit, and the output lead is configured to deliver an output current based on a sum of the first transconductance and the second transconductance.

In another implementation, the disclosed amplifier includes a first common-source (CS) transistor, a first common-gate (CG) transistor, a second CS transistor, and a second CG transistor. The first CS transistor has a first CS gate node that is configured to sense a first differential signal of a radio frequency (RF) signal. The first CG transistor has a first CG drain node and a first CG source node. The first CG drain node is coupled with the first CS transistor, whereas the first CG source node is configured to receive a first input current driven by a second differential signal of the RF signal. In general, the second differential signal has the same magnitude as but an opposite polarity from the first differential signal. The second CS transistor has a second CS gate node that is configured to sense the second differential signal of the RF signal. The second CG transistor has a second CG drain node and a second CG source node. The second CG drain node is coupled with the second CS transistor. The second CG source node is configured to receive a second input current driven by the first differential signal of the RF signal.

In yet another implementation, the disclosed front-end receiver includes an antenna and an amplifier. The antenna is configured to receive a radio frequency (RF) signal. The amplifier is coupled with the antenna. The amplifier includes a common-source (CS) circuit, a common-gate (CG) circuit, and an output lead. The CS circuit defines a first transconductance based on a bias current. The CG circuit is coupled with the CS circuit. The CG circuit defines a second transconductance based on the bias current such that the second transconductance is used for matching an input impedance associated with the RF signal. The output lead is coupled with the CS circuit and the CG circuit, and the output lead is configured to deliver an output current based on a sum of the first transconductance and the second transconductance.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
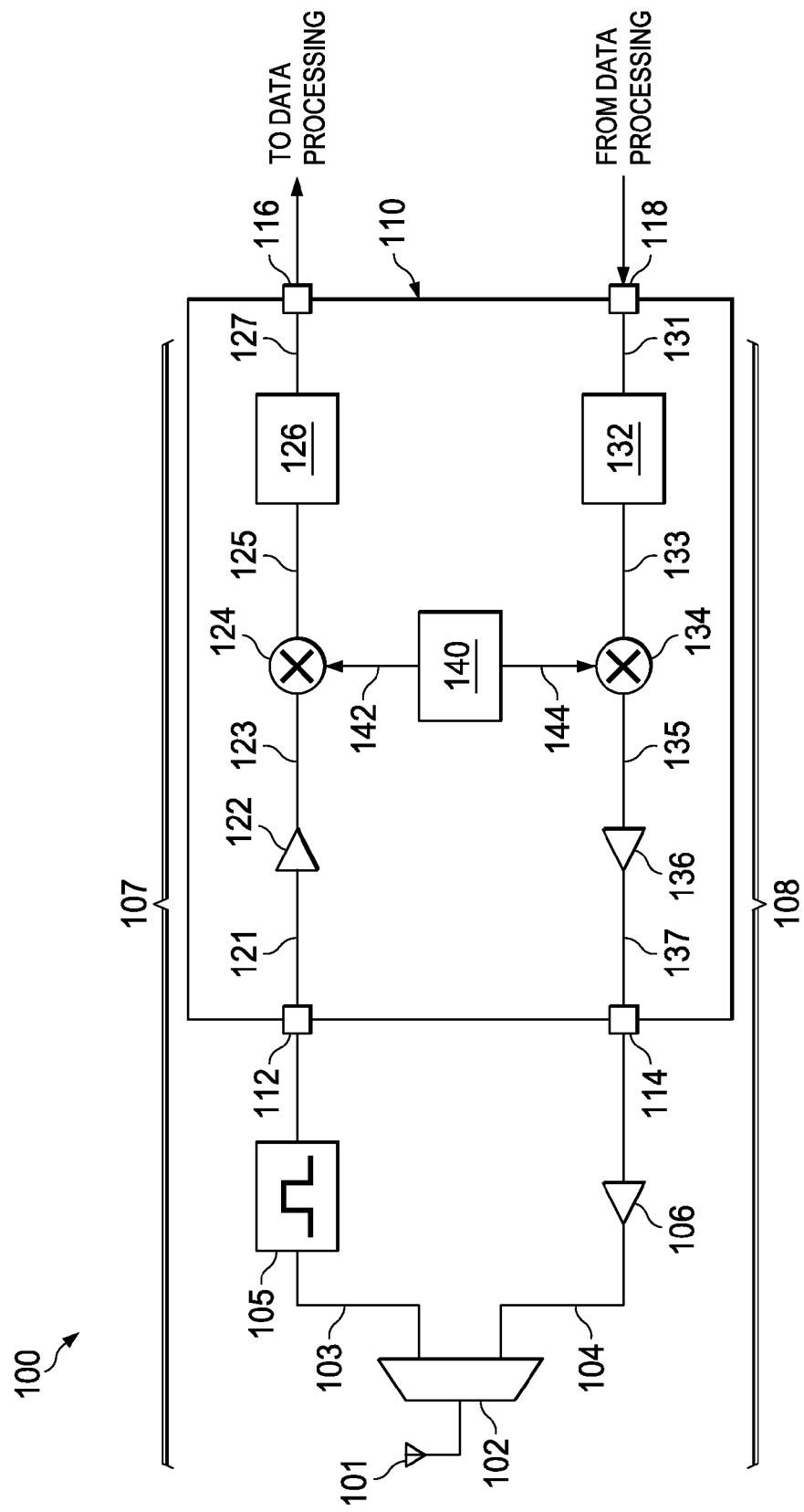
FIG. 1 shows a schematic view of a front-end transceiver system according to an aspect of the present disclosure.

FIG. 1 shows a schematic view of a front-end transceiver system (FETS) 100 according to an aspect of the present disclosure. The FETS 100 includes a front-end receiver (FER) circuit (a.k.a. front-end reception path) 107 and a front-end transmitter (FET) circuit (a.k.a. front-end transmission path) 108. The FER circuit 107 and the FET circuit 108 may share an antenna 101, which is selectively accessed via an antenna switch 102. In an alternative implementation, the FER circuit 107 and the FET circuit 108 circuit may each have its own antenna, such that the antenna switch 102 can be removed from the FETS 100. The FETS 100 can be implemented on a printed circuit board (PCB) with discrete circuit components (i.e., off-chip components) and/or a front-end transceiver integrated circuit (FETIC) 110 having integrated circuit components (i.e., on-chip components). The FETIC 110 implements a portion of the FER circuit 107 as well as a portion of the FET circuit 108.

The FER circuit 107 includes a bandpass filter 105, a matching amplifier 122, a reception mixer 124, and a reception baseband circuit 126. The bandpass filter 105 is coupled with the antenna 101 via the antenna switch 102. When the FER 107 is activated, the bandpass filter 105 receives a reception radio frequency (RF) signal 103 from the antenna 101. The bandpass filter 105 removes power of the sideband frequencies from the reception RF signal 103 before generating a bandpass reception RF signal 121. In the event that the antenna 101 has bandpass capabilities, the bandpass filter 105 can be removed from the FER circuit 105. The FETIC 110 receives the bandpass reception RF signal 121 via its RF input port 112. Being a part of the FETIC 110, the matching amplifier 122 receives the bandpass reception RF signal 121 from the RF input port 112.

The matching amplifier 122 is configured to match the input impedance associated with the reception RF signal 103 while providing a substantial gain (e.g., a total gain of about 2 db) for the reception RF signal 103. The matching amplifier 122 generates an amplified reception RF signal 123 that is ready for down conversion. The reception mixer 124 is coupled with the matching amplifier 122 to receive the amplified reception RF signal 123. The reception mixer is also coupled with a local oscillation circuit 140 to receive a reception local oscillation signal 142 for down-converting the amplified reception RF signal 123 from a carrier frequency to a baseband frequency. As a result of the down conversion, the reception mixer 124 generates a reception baseband signal 125.

The reception baseband circuit 126 is coupled with the reception mixer 125 to receive the reception baseband signal 125. The reception baseband circuit 126 converts the reception baseband signal 125 from its analog form to digital form. And in the event that the received digital data is modulated (e.g., In-phase/Quadrature modulation), the reception baseband circuit 126 also demodulates the reception baseband signal 125. As a result of the analog-to-digital conversion and the optional demodulation, the reception baseband circuit 126 generates a reception data signal 127, which is delivered to a data output port 116 of the FETIC 110

The FET circuit 108 includes a transmission baseband circuit 132, a transmission mixer 134, a pre-power amplifier 136, and a power amplifier 106. Being a part of the FETIC 110, the transmission baseband circuit 132 receives a transmission data signal 131 via a data input port 118 of the FETIC 110. The transmission baseband circuit 132 converts the transmission data signal 131 from its digital form to a digital form. The transmission baseband circuit 132 also modulates the transmission data signal 131 according to one or more modulation schemes (e.g., In-phase/Quadrature modulation) that the FETS 100 adopts. As a result of the digital-to-analog conversion and the optional modulation, the transmission baseband circuit 132 generates a transmission baseband signal 133.

The transmission mixer 134 is coupled with the transmission baseband circuit 132 to receive the transmission baseband signal 133. The transmission mixer 134 is also coupled with the local oscillation signal 140 to receive a transmission local oscillation signal 144 for up-converting the transmission baseband signal 133 from a baseband frequency to a carrier frequency. As a result of the up conversion, the transmission mixer 134 generates a transmission RF signal 135. The transmission RF signal 135 may be amplified by the pre-power amplifier 136 to become an amplified transmission RF signal 137. The FETIC 110 delivers the amplified transmission RF signal 137 at its RF output port 114, which is coupled to the power amplifier 106. The power amplifier 106 then further amplifies the amplified transmission RF signal 137 to generate a power-amplified transmission RF signal 104. When the FET 108 is activated for transmission, the power amplifier 106 is coupled with the antenna 101 via the antenna switch 102. Accordingly, the power amplifier 106 delivers the power-amplified transmission RF signal 104 to the antenna 101 for transmission.

Figure 2:
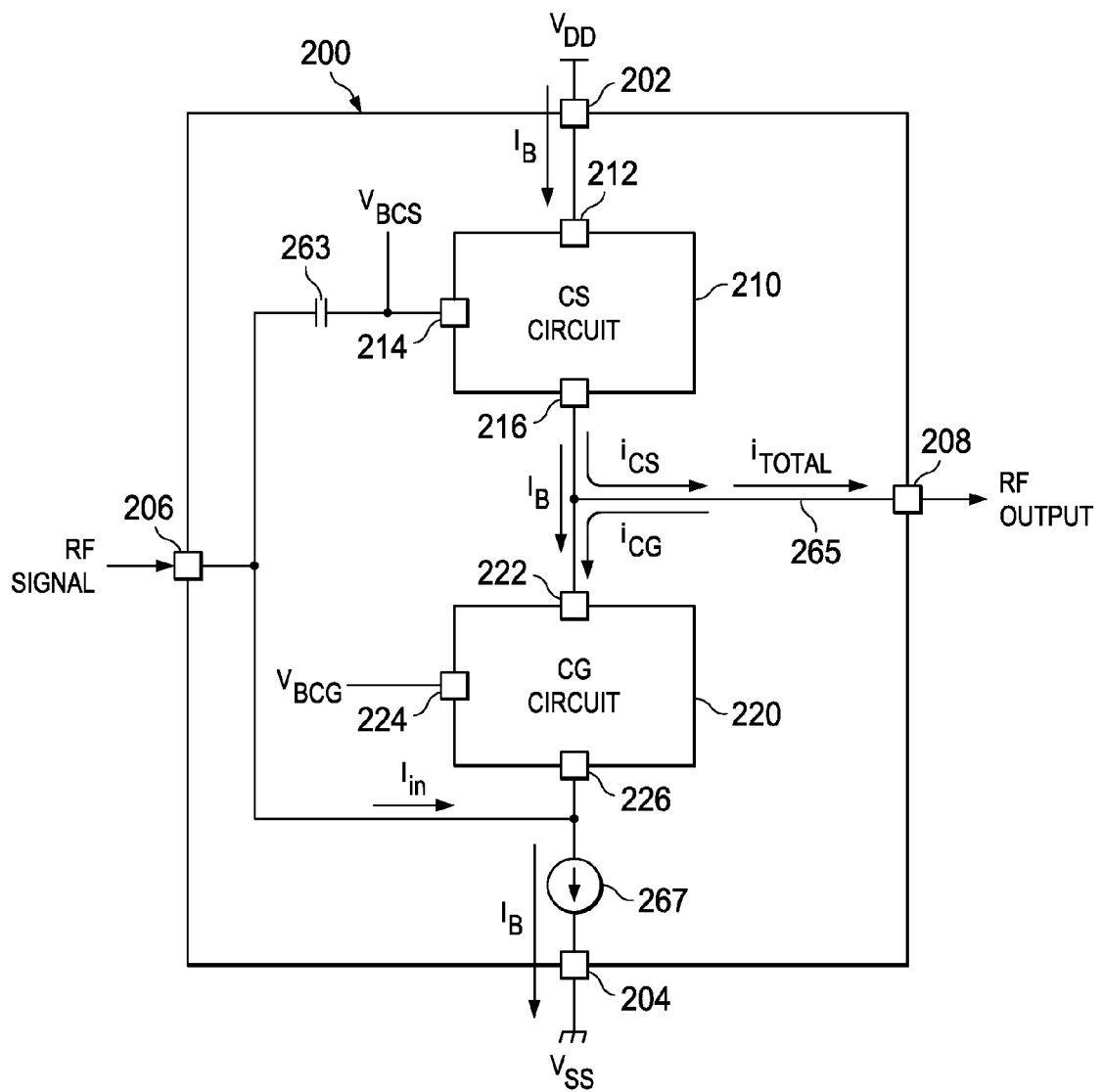
FIG. 2 shows a schematic view of a matching amplifier according to an aspect of the present disclosure.

FIG. 2 shows a schematic view of a matching amplifier 200 according to an aspect of the present disclosure. The matching amplifier 200 may be used for implementing the matching amplifier 122 as described in FIG. 1. Thus, the matching amplifier 200 can be incorporated as a part of the FETIC 110. Alternatively, the matching amplifier 200 can be fabricated in a separate integrated circuit, which is attachable to a PCB for building the FER circuit 107.

The periphery of the matching amplifier 200 includes a first power supply port 202, a second power supply port 204, an RF input port 206, and an RF output port 208. The first power supply port 202 can be used for receiving a high voltage source, such as a VDD source, whereas the second power supply port 204 can be used for receiving a low voltage source, such as a VSS source. The first and second power supply ports 202 and 204 can also be connected to other transistor nodes for receiving a potential difference across these two ports.

The RF input port 206 is configured to receive an RF signal, such as the reception RF signal 103 or the bandpass RF signal 121. The received RF signal can be a differential pair including a first differential RF (DRF) signal and a second DRF signal. The first and second DRF signals may have the same magnitude but opposite polarities at any given point of time. The FETS 100 may include a balun circuit after the bandpass filter 105 for splitting the bandpass RF signal 121 into a pair of DRF signals.

The RF output port 208 is configured to deliver an output RF signal based on the amplification operation of the matching amplifier 200. Depending on the load components connected to the RF output port 208, the output RF signal can be a current signal or a voltage signal. If the input RF signal is a pair of DRF signals, the output RF signal will be a pair of DRF signals as well.

The interior of the matching amplifier 200 includes a common-source circuit 210, a common-gate circuit 220, an input capacitor 263, an output lead 265, and a current source 267. The CS circuit 210 has a CS source terminal 212, a CS gate terminal 214, and a CS drain terminal 216. The CS circuit 210 includes one or more transistors (e.g., a MOSFET) each of which is arranged in a common source configuration. The CS source terminal 212 is connected to the first power supply port 202, and the CS source terminal 212 can be used for accessing one or more source nodes of the CS transistors in the CS circuit 210. The CS gate terminal 214 is coupled with the RF input port 206 via the input capacitor 263. As a result of this coupling, the reception RF signal received at the RF input port 206 can be sensed by the gate nodes of one or more transistors in the CS circuit 210. The CS gate terminal 214 is also coupled to a DC bias voltage $V_{BCS}$.

Together, the DC bias voltage ($V_{BCG}$) and the first power source (e.g., VDD) establish a gate-source voltage bias for the CS circuit 210, which is configured to conduct a bias current ($I_B$). The physical characteristics of the transistors in the CS circuit 210 defines a first transconductance ($G_{m1}$) based on the bias current ($I_B$). For example, the first transconductance ($G_{m1}$) can be expressed by Equation (1) below.

$$G_{m1} = \sqrt{2\mu_1 C_{ox1}\left(\frac{W_1}{L_1}\right)I_B} \qquad \text{Eq. (1)}$$

The physical characteristics of the transistors in the CS circuit 210 include the carrier (e.g., electrons or holes) mobility ($\mu_1$), gate-oxide capacitance ($Cox_1$), transistor width ($W_1$), and transistor length ($L_1$). The bias current ($I_B$) can also be adjusted based on the threshold voltage (i.e., $V_{TH1}$) of one or more transistors in the CS circuit 210, and the potential difference (i.e., $V_{GS1}$) between the CS gate terminal 214 (e.g., $V_{BCS}$) and the CS source terminal (e.g., $V_{DD}$) 212. Accordingly, the first transconductance ($G_{m1}$) can also be expressed by Equation (2) below.

$$G_{m1} = \frac{2I_B}{V_{GS1} - V_{TH1}} \qquad \text{Eq. (2)}$$

The CS drain terminal 216 of the CS circuit is coupled to an output lead 265 of the matching amplifier 200. The CS drain terminal 216 is configured to deliver a CS output current ($i_{cs}$) to the output lead 265 in response to the reception RF signal. The CS output current ($i_{cs}$) can be collected from one or more drain nodes of the transistors in the CS circuit 210. The CS output current ($i_{cs}$) is a function of the reception RF signal voltage ($V_{in}$) and the first transconductance ($G_{m1}$). More specifically, the CS output current ($i_{cs}$) can be expressed by Equation (3) below.

$$i_{CS} = G_{m1}(v_{in}) \qquad \text{Eq. (3)}$$

The CG circuit 220 has a CG drain terminal 222, a CG gate terminal 224, and a CG source terminal 226. The CG circuit 220 includes one or more transistors (e.g., a MOSFET) each of which is arranged in a common gate configuration. The CG gate terminal 224 is configured to receive a bias voltage $V_{GCG}$. The CG gate terminal 224 can be used for accessing one or more gate nodes of the transistors in the CG circuit 220. The CG source terminal 226 is coupled to a current source 267 for receiving the bias current $I_B$). The CG source terminal 226 can be used for accessing one or more source nodes of the transistors in the GC circuit 220. The current source 267 may include an active current mirror, or a passive resistor for setting a source bias voltage for the CG circuit 220.

Together, the DC bias voltage ($V_{BCG}$) and the source bias voltage establish a gate-source voltage bias for the CG circuit 220, which is configured to conduct the same bias current ($I_B$) as the CS circuit 210. Similar to the first transconductance ($G_{m1}$), the physical characteristics of the transistors in the CG circuit 220 defines a second transconductance ($G_{m2}$) based on the bias current ($I_B$). For example, the second transconductance ($G_{m2}$) can be expressed by Equation (4) below.

$$G_{m2} = \sqrt{2\mu_2 C_{ox2}\left(\frac{W_2}{L_2}\right)I_B} \qquad \text{Eq. (4)}$$

The physical characteristics of the transistors in the CG circuit 220 include the carrier (e.g., electrons or holes) mobility ($\mu_2$), gate-oxide capacitance ($Cox_2$), transistor width ($W_2$), and transistor length ($L_2$). The bias current ($I_B$) can also be adjusted based on the threshold voltage (i.e., $V_{TH2}$) of one or more transistors in the CG circuit 220, and the potential difference (i.e., $V_{GS2}$) between the CG gate terminal 224 (e.g., $V_{BCG}$) and the CG source terminal. Accordingly, the second transconductance ($G_{m2}$) can also be expressed by Equation (5) below.

$$G_{m2} = \frac{2I_B}{V_{GS2} - V_{TH2}} \qquad \text{Eq. (5)}$$

The CG drain terminal 222 is coupled with the CS drain terminal 216 to share the bias current ($I_B$) between the CG circuit 220 and the CS circuit 210. Also, the CG drain terminal 222 is coupled to the output lead 265 of the matching amplifier 200. The CG drain terminal 222 is configured to deliver a CG output current ($i_{CG}$) to the output lead 265 in response to the reception RF signal. The CG output current ($i_{CG}$) can be collected from one or more drain nodes of the transistors in the CG circuit 220. The CG output current ($i_{CG}$) is a function of the reception RF signal voltage ($V_{in}$) and the second transconductance ($G_{m2}$). More specifically, the CG output current ($i_{CG}$) can be expressed by Equation (6) below.

$$i_{CG} = G_{m2}(v_{in}) \qquad \text{Eq. (6)}$$

In a common-gate configuration, the input current ($I_{in}$) is substantially the same as the output current, which is the CG output current ($i_{CG}$) as shown in FIG. 2. Also, the input impedance (Zin) is characterized by a ratio of the input voltage ($V_{in}$) over the input current ($I_{in}$), both of which are in the RF domain. According to Equation (6), the second transconductance ($G_{m2}$) is a function of the output current ($i_{CG}$) divided by the input voltage ($V_{in}$). Thus, the reciprocal of the second transconductance ($G_{m2}$) matches with the input impedance ($Z_{in}$). Because of this input impedance matching, the CG circuit 220 allows an efficient power transfer from the input RF signal received at the RF input port 206 to the output RF signal delivered to the RF output port 208. To strike a balance between maximum power transfer and minimum noise attenuation, the second transconductance ($G_{m2}$) is maintained at approximately one-fiftieth of an ohm over a broadband frequency range of the input RF signal. In one implementation, for example, the second transconductance ($G_{m2}$) may have a 5% deviation from one-fiftieth of an ohm. In another implementation, for example, the second transconductance ($G_{m2}$) may have a 10% deviation from one-fiftieth of an ohm.

In a differential input configuration, the CG source terminal 226 is configured to receive a differential radio frequency (DRF) signal that has the opposite polarity of another DRF signal that the CS gate terminal 214 is configured to sense. For instance, the input RF signal may include a first DRF signal carrying a first input voltage ($V_{in}$) and a second DRF signal carrying a second input voltage ($-V_{in}$) that has the same magnitude but an opposite polarity from the first input voltage ($V_{in}$). As such, the CG output current ($i_{CG}$) can be re-written according to Equation (7) below.

$$i_{CG} = -G_{m2}(v_{in}) \qquad \text{Eq. (7)}$$

Unlike the CG output current ($i_{CG}$) as expressed by Equation (6), the CG output current ($i_{CG}$) as expressed by Equation (7) flows from the CG source terminal 226 to the CG drain terminal 222. However, the change of polarity of the CG output current ($i_{CG}$) does not affect the input impedance matching because it does not affect the relationship between the input current and output current of the CG circuit 220. Moreover, the change of the polarity of the CG output current ($i_{CG}$) does not affect the total output current ($i_{TOTAL}$) of the matching amplifier 200. This is because the total output current ($i_{TOTAL}$) is defined as the difference of the CS output current ($i_{CS}$) and the CG output current ($i_{CG}$), and these two currents are based on two input voltages (i.e., +Vin and −Vin) having the opposite polarities. Accordingly, the total output current ($i_{TOTAL}$) can be expressed by Equation (8) regardless whether the input RF signal is a single signal or a pair of differential signal.

$$i_{TOTAL} = i_{CS} - i_{CG} \qquad \text{Eq. (8)}$$

Substituting Equations (3) and (7) into Equation (8), the total output current ($i_{TOTAL}$) of the matching amplifier 200 is a summation function of the first transconductance ($G_{m1}$) and the second transconductance ($G_{m2}$), which is expressed by Equation (9) below.

$$i_{TOTAL} = v_{in}(G_{m1} + G_{m2}) \qquad \text{Eq. (9)}$$

With this CS-CG architecture, the matching amplifier 200 advantageously breaks free from the tradeoff between input impedance matching and gain boosting. On the one hand, the CG circuit 220 provides the input impedance matching and a moderate gain based on the second transconductance ($G_{m2}$). And on the other hand, the CS circuit 210 provides a gain boost based on the first transconductance ($G_{m1}$), which is generally independent of the input impedance as received at the RF input port 206. Moreover, because the CS circuit 210 and the CG circuit 220 share the same bias current ($I_B$), the matching amplifier 200 is power efficient and less susceptible to noise.

Figure 3:
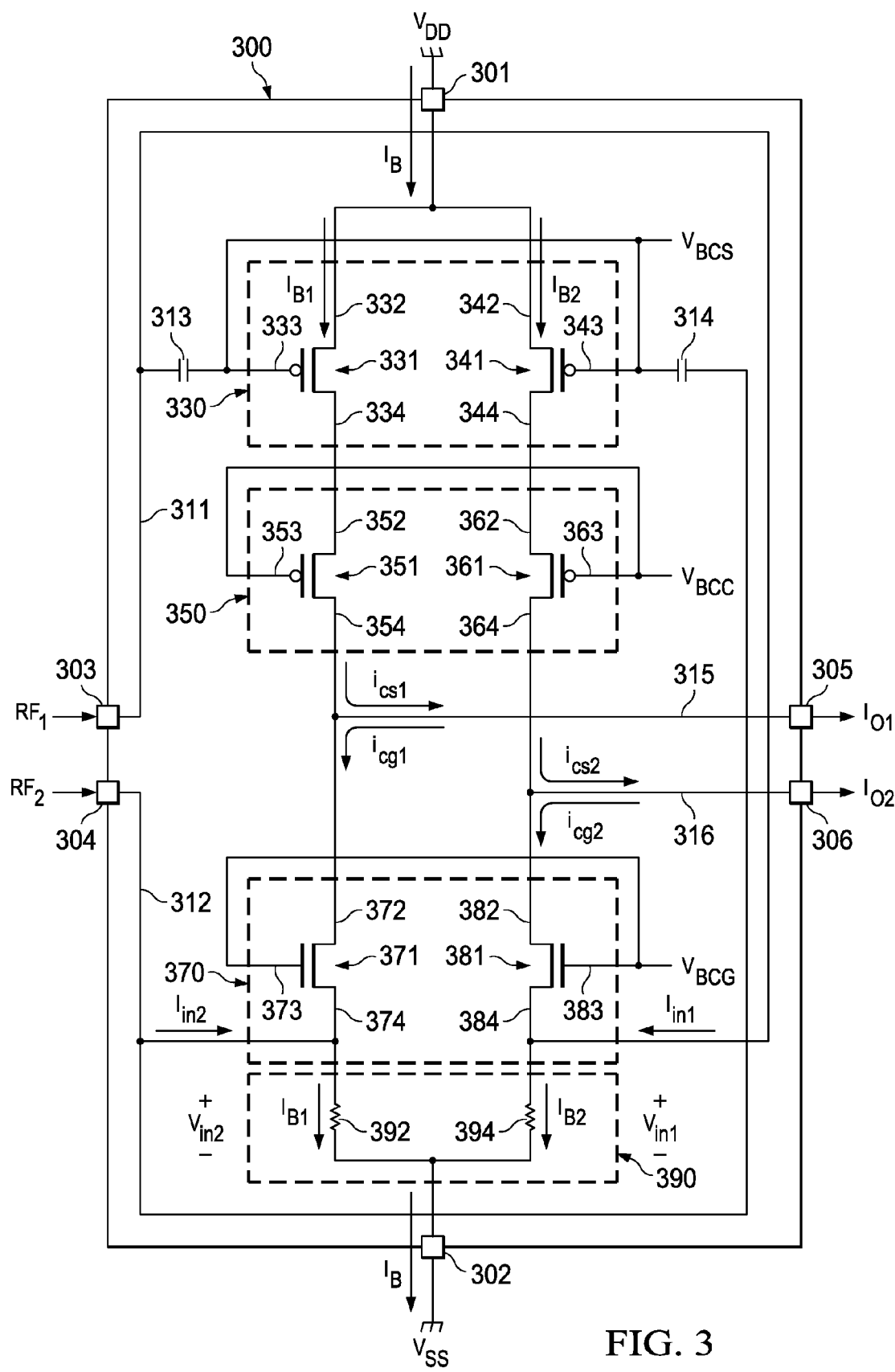
FIG. 3 shows a schematic view of a differential matching amplifier according to an aspect of the present disclosure.

FIG. 3 shows a schematic view of a differential matching amplifier (DMA) 300 according to an aspect of the present disclosure. The DMA 300 can be used as a specific implementation of the matching amplifier 200 as described in FIG. 2. While the DMA 300 may operate within the confines of the matching amplifier 200, the DMA 300 does not restrict or limit the other implementations of the matching amplifier 200. In particular, the DMA 300 is adapted to receive and amplify RF signal in a differential mode. Thus, the DMA 300 is able to process differential RF (DRF) signals in a similar fashion as the matching amplifier 200.

The periphery of the DMA 300 includes a first power supply port 301, a second power supply port 302, a first RF input port 303, a second RF input port 304, a first RF output port 305, and a second RF output port 306. The first power supply port 301 can be used for receiving a high voltage source, such as a VDD source, whereas the second power supply port 302 can be used for receiving a low voltage source, such as a VSS source. The first and second power supply ports 301 and 302 can also be connected to other transistor nodes for receiving a potential difference across these two ports.

The first RF input port 303 is configured to receive a first DFR signal 311, whereas the second RF input port 305 is configured to receive a second DFR signal 312. Consistent with the aforementioned description, the first and second DFR signal 311 and 312 have the same magnitude but opposite polarities at any given point of time. The first RF output port 305 is configured to deliver a first output current ($I_{O1}$), whereas the second RF output port 306 is configured to deliver a second output current ($I_{O2}$). In a configuration that the first and second RF output ports 305 and 306 are each connected to an output load, the first and second output currents ($I_{O1}$) and ($I_{O2}$) establish a first output voltage and a second output voltage across the respective output load.

The interior of the DMA 300 includes a common-source (CS) circuit 330, a cascode circuit 350, a common-gate (CG) circuit 370, and a source bias circuit 390. In general, the CS circuit 330 is coupled with the first power supply port 301 to receive the high voltage (e.g., VDD). The cascode circuit 350 is coupled to the CS circuit 330. The CG circuit 370 is coupled with the CS circuit 330 via the cascode circuit 350. The source bias circuit 390 is coupled between the CG circuit 370 and the second power supply port 302. The source bias circuit 390 serves as a passive current source for draining the bias current ($I_B$) shared between the CS circuit 330 and the CG circuit 370.

The CS circuit 330 includes a first CS transistor 331 and a second CS transistor 341. The first CS transistor 331 has a first CS source node 332, a first CS gate node 333, and a first CS drain node 334. The first CS transistor 331 is in a CS configuration because the first CS source node 332 is connected with a DC source (e.g., VDD). The first CS gate node 333 is connected to a first input capacitor 313 with a configuration that enables the first gate node 333 to sense the first DRF signal 311. The first CS gate node 333 is connected to receive a CS bias voltage ($V_{BCS}$) for conducting a first bias current ($I_{B1}$) from the first CS source node 332 to the first CG drain node 334.

The first CS transistor 331 defines a first CS transconductance ($G_{m\_cs1}$) based on the first bias current ($I_{B1}$) and according to Equations (1) and (2) as described above. Based on the first CS transconductance ($G_{m\_sc1}$), the first CS transistor 331 is configured to generate a first CS output current ($i_{cs1}$) according to Equation (3) as described above. The first CS drain node 334 is coupled with the first output lead 315 via the cascode circuit 350 to deliver the first CS output current ($i_{cs1}$). Depending on the particular implementation, the first CS transistor 331 can be a P-channel transistor as shown in FIG. 3, or it can be an N-channel transistor in an alternative configuration.

The second CS transistor 341 has a second CS source node 342, a second CS gate node 343, and a second CS drain node 344. Like the first CS transistor 331, the second CS transistor 341 is in a CS configuration because the second CS source node 342 is connected with a DC source (e.g., VDD). The second CS gate node 343 is connected to a second input capacitor 314 with a configuration that enables the second gate node 343 to sense the second DRF signal 312. The second CS gate node 343 is connected to receive the CS bias voltage ($V_{BCS}$) for conducting a second bias current ($I_{B2}$) from the second CS source node 342 to the second CS drain node 344.

The second CS transistor 341 defines a second CS transconductance ($G_{m\_cs2}$) based on the second bias current ($I_{B2}$) and according to Equations (1) and (2) as described above. Based by the second CS transconductance ($G_{m\_cs2}$), the second CS transistor 341 is configured to generate a second CS output current ($i_{cs2}$) according to Equation (3) as described above. The second CS drain node 344 is coupled with the second output lead 316 via the cascode circuit 350 to deliver the second CS output current ($i_{cs2}$). Depending on the particular implementation, the second CS transistor 341 can be a P-channel transistor as shown in FIG. 3, or it can be an N-channel transistor in an alternative configuration.

The cascode circuit 350 includes a first cascode transistor 351 and a second cascode transistor 361. The first cascode transistor 351 has a first cascode source node 352, a first cascode gate node 353, and a first cascode drain node 354. The first cascode transistor 351 decouples the parasitic effect of the first CS transistor 331 from a first output lead 315 of the DMA 300. As such, the first cascode transistor 351 serves as a means for isolating the first DRF signal 311 from the first RF output signal, which is delivered to the first output lead 315. The first cascode transistor 351 also boosts the output impedance of the first CS transistor 331. The first cascode gate node 353 is connected to receive a cascode bias voltage ($V_{BCC}$) for conducting the first bias current ($I_{B1}$). The first cascode drain node 354 is coupled with the CG circuit 370 and the first output lead to deliver the first RF output (e.g., an RF current and/or an RF voltage). Depending on the particular implementation, the first cascode transistor 351 can be a P-channel transistor as shown in FIG. 3, or it can be an N-channel transistor in an alternative configuration.

The second cascode transistor 361 has a second cascode source node 362, a second cascode gate node 363, and a second cascode drain node 364. The second cascode transistor 361 decouples the parasitic effect of the second CS transistor 341 from a second output lead 316 of the DMA 300. As such, the second cascode transistor 361 serves as a means for isolating the second DRF signal 312 from the second RF output signal, which is delivered a the second output lead 316. The second cascode transistor 361 also boosts the output impedance of the second CS transistor 341. The second cascode gate node 363 is connected to receive a cascode bias voltage ($V_{BCC}$) for conducting the second bias current ($I_{B2}$). The second cascode drain node 364 is coupled with the CG circuit 370 and the second output lead 316 to deliver the second RF output (e.g., an RF current and/or an RF voltage). Depending on the particular implementation, the second cascode transistor 361 can be a P-channel transistor as shown in FIG. 3, or it can be an N-channel transistor in an alternative configuration.

The CG circuit includes a first CG transistor 371 and a second CG transistor 381. The first CG transistor 371 has a first CG drain node 372, a first CG gate node 373, and a first CG source node 374. The first CG transistor 371 is in a CG configuration because the first CG gate node 373 is connected to a DC source. More specifically, the first CG gate node 373 is connected to receive a CG bias voltage ($V_{BCG}$) for conducting the first bias current ($I_{B1}$). The first CG transistor 371 receives the first bias current ($I_{B1}$) from the first CG drain node 372 and delivers it to the source bias circuit 390 via the first CG source node 374. The first CG transistor 371 defines a first CG transconductance ($G_{m\_cg1}$) based on the first bias current ($I_{B1}$) and according to Equations (4) and (5) as described above. The first CG source node 374 is coupled with the second RF input port 304 to receive a second input current ($I_{in2}$) driven by the second DRF signal 312. As described in Equation (6) above, the first CG transconductance ($G_{m\_cg1}$) matches with the input impedance in association with the second input current ($I_{in2}$).

The second input current ($I_{in2}$) establishes a second input voltage ($V_{in2}$) across the source bias circuit 390. Based on the first CG transconductance ($G_{m\_cg1}$) and in response to the second input voltage ($V_{in2}$), the first CG transistor 371 is configured to generate a first CG output current ($i_{cg1}$) according to Equation (7) as described above. The first CG drain node 372 is coupled with the first output lead 315 to deliver the first CG output current ($i_{cg1}$). The first CG output current ($i_{cg1}$) joins the first CS output current ($i_{cs1}$) at the first output lead 315 to form the first output current ($I_{O1}$). According to Equation (9), the first output current (IO1) is a summation function of the first CS transconductance ($G_{m\_cs1}$) and the first CG transconductance ($G_{m\_cg1}$).

The second CG transistor 381 has a second CG drain node 382, a second CG gate node 383, and a second CG source node 384. Like the first CG transistor 371, the second CG transistor 381 is in a CG configuration because the second CG gate node 383 is connected to a DC source. More specifically, the second CG gate node 383 is connected to receive a CG bias voltage ($V_{BCG}$) for conducting the second bias current ($I_{B2}$). The second CG transistor 381 receives the second bias current ($I_{B2}$) from the second CG drain node 382 and delivers it to the source bias circuit 390 via the second CG source node 374. The second CG transistor 381 defines a second CG transconductance ($G_{m\_cg2}$) based on the second bias current ($I_{B2}$) and according to Equations (4) and (5) as described above. The second CG source node 384 is coupled with the first RF input port 303 to receive a first input current ($I_{in1}$) driven by the first DRF signal 311. As described in Equation (6) above, the second CG transconductance ($G_{m\_cg2}$) matches with the input impedance in association with the first input current ($I_{in1}$).

The first input current ($I_{in1}$) establishes a first input voltage ($V_{in1}$) across the source bias circuit 390. Based on the second CG transconductance ($G_{m\_cg2}$) and in response to the first input voltage ($V_{in1}$), the second CG transistor 381 is configured to generate a second CG output current ($i_{cg2}$) according to Equation (7) as described above. The second CG drain node 382 is coupled with the second output lead 316 to deliver the second CG output current ($i_{cg2}$). The second CG output current ($i_{cg2}$) joins the second CS output current ($i_{cs2}$) at the second output lead 316 to form the second output current ($I_{O2}$). According to Equation (9), the second output current (IO2) is a summation function of the second CS transconductance ($G_{m\_cs2}$) and the second CG transconductance ($G_{m\_cg2}$).

The source bias circuit 390 is coupled to the source terminal of the CG circuit 370. With this configuration, the source bias circuit 390 conducts the first bias current ($I_{B1}$) and the second bias current ($I_{B2}$) and delivers these two currents as a single bias current ($I_B$) to the second power supply port 302. The source bias circuit 390 includes a first bias resistor 392 and a second bias resistor 394.

The first bias resistor 392 is connected to the first CG source node 374 to conduct the first bias current ($I_{B1}$) that passes through the first CS transistor 331 and the first CG transistor 371. Together, the first CS transistor 331, the first cascode transistor 351, the first CG transistor 371, and the first bias resistor 392 form a first current path that shares the same first bias current ($I_{B1}$). The first current path implements the CS-CG architecture as described in FIG. 2. With this CS-CG architecture, the first current path of the DMA 300 advantageously breaks free from the tradeoff between input impedance matching and gain boosting.

On the one hand, the first CG transistor 331 provides the input impedance matching associated with the second input current ($I_{in2}$), as well as a moderate gain based on the first CG transconductance ($G_{m\_cg1}$). And on the other hand, the first CS transistor 331 provides additional gain boost based on the first CS transconductance ($G_{m\_cs1}$), which is generally independent of the input impedance associated with the second input current ($I_{in2}$). Moreover, because the first CS transistor 331 and the first CG transistor 371 share the same first bias current ($I_{B1}$), the first current path of the DMA 300 is power efficient and less susceptible to noise.

The second bias resistor 394 is connected to the second CG source node 384 to conduct the second bias current ($I_{B2}$) that passes through the second CS transistor 341 and the second CG transistor 381. Together, the second CS transistor 341, the second cascode transistor 361, the second CG transistor 381, and the second bias resistor 394 form a second current path that shares the same second bias current ($I_{B2}$). Like the first current path, the second current path also implements the CS-CG architecture as described in FIG. 2. With this CS-CG architecture, the second current path of the DMA 300 advantageously breaks free from the tradeoff between input impedance matching and gain boosting.

On the one hand, the second CG transistor 341 provides the input impedance matching associated with the first input current ($I_{in1}$), as well as a moderate gain based on the second CG transconductance ($G_{m\_cg2}$). And on the other hand, the second CS transistor 341 provides additional gain boost based on the second CS transconductance ($G_{m\_cs2}$), which is generally independent of the input impedance associated with the first input current ($I_{in1}$). Moreover, because the second CS transistor 341 and the second CG transistor 381 share the same second bias current ($I_{B2}$), the second current path of the DMA 300 is power efficient and less susceptible to noise.

Implementing the CS-CG architecture using a pair of complimentary inputs allows the DMA 300 to overcome noise issues faced by single-transistor amplifiers (e.g., a single CG transistor, a single CS transistor, and a single CD transistor). In low noise applications, for instance, conventional amplifiers avoid stacking transistors on top of each other to avoid additional source of noise. The complimentary inputs provided to the current paths of the DMA 300 create a noise cancellation loop that cancels or reduce the noises generated by stacked transistors.

To illustrate the operation of the noise cancellation loop, it can be assumed that the first CG transistor 371 includes a certain amount of channel noise that creates a first CG noise current. Initially, the first CG noise current increases the first CG output current ($i_{cg1}$) and causes the second input voltage ($V_{in2}$) to rise. As a result, the increased second input voltage ($V_{in2}$) reduces the potential difference with the first input voltage ($V_{in1}$). Such a reduction causes the first CS transistor 331 to increase the first CS output current ($i_{cs1}$). The increased first CS output current ($i_{cs1}$) compensates the increase of the first CG output current ($i_{cg1}$) due to the first CG noise current, thereby cancelling the noise produced at the first output current ($I_{O1}$).

Figure 4:
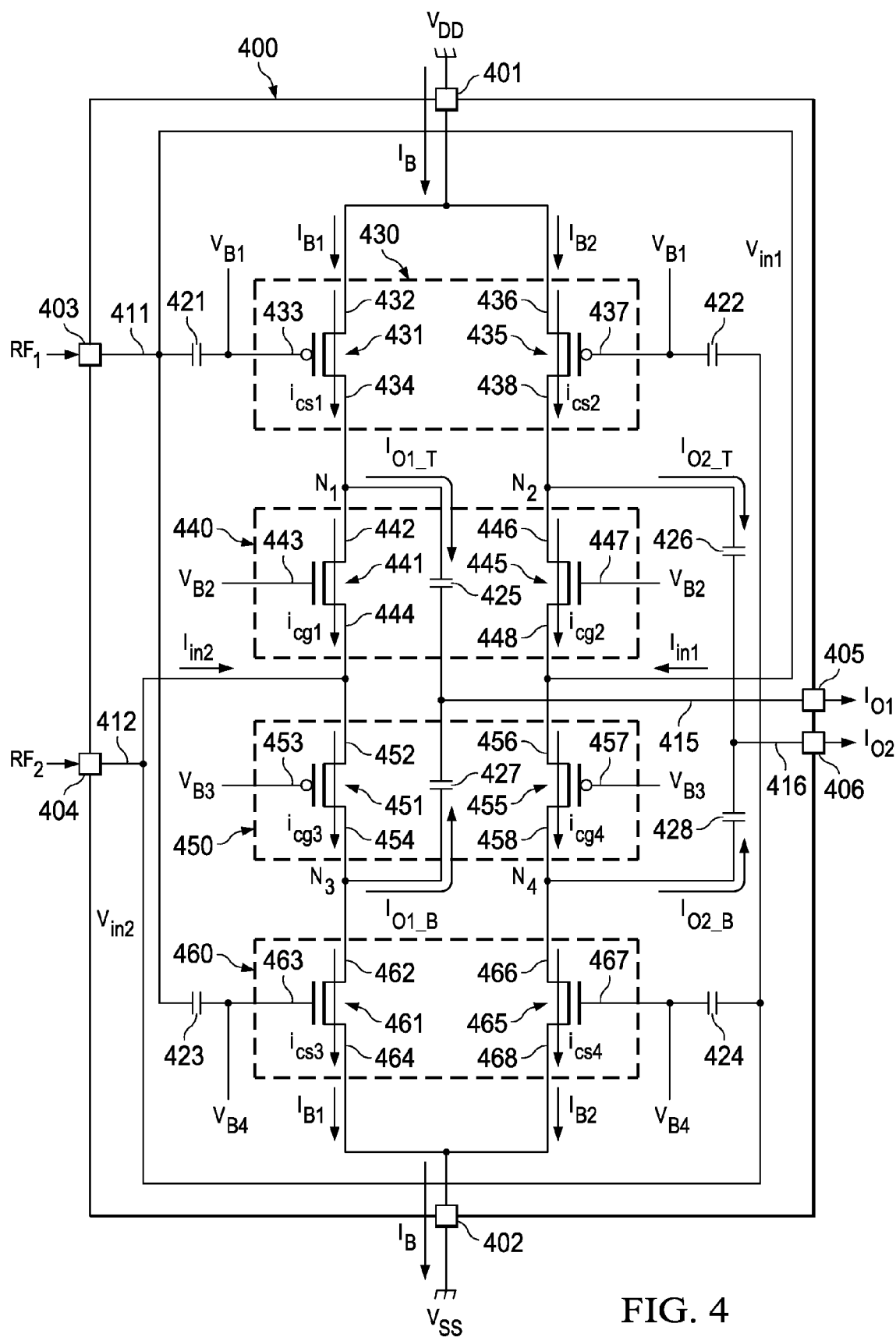
FIG. 4 shows a schematic view of another differential matching amplifier according to another aspect of the present disclosure.

FIG. 4 shows a schematic view of another differential matching amplifier (DMA) 400 according to another aspect of the present disclosure. Like the DMA 300, the DMA 400 can be used as a specific implementation of the matching amplifier 200 as described in FIG. 2. While the DMA 400 may operate within the confines of the matching amplifier 200, the DMA 400 does not restrict or limit the other implementations (e.g., the DMA 300) of the matching amplifier 200. In particular, the DMA 400 is adapted to receive and amplify RF signal in a differential mode. Thus, the DMA 400 is able to process differential RF (DRF) signals in a similar fashion as the matching amplifier 200.

The periphery of the DMA 400 includes a first power supply port 401, a second power supply port 402, a first RF input port 403, a second RF input port 404, a first RF output port 405, and a second RF output port 406. The first power supply port 401 can be used for receiving a high voltage source, such as a VDD source, whereas the second power supply port 402 can be used for receiving a low voltage source, such as a VSS source. The first and second power supply ports 401 and 402 can also be connected to other transistor nodes for receiving a potential difference across these two ports.

The first RF input port 403 is configured to receive a first DFR signal 411, whereas the second RF input port 405 is configured to receive a second DFR signal 412. Consistent with the aforementioned description, the first and second DFR signal 411 and 412 have the same magnitude but opposite polarities at any given point of time. The first RF output port 405 is configured to deliver a first output current ($I_{O1}$), whereas the second RF output port 406 is configured to deliver a second output current ($I_{O2}$). In a configuration that the first and second RF output ports 405 and 406 are each connected to an output load, the first and second output currents ($I_{O1}$) and ($I_{O2}$) establish a first output voltage and a second output voltage across the respective output load.

The interior of the DMA 400 includes a first common-source (CS) circuit 430, a first common-gate (CG) circuit 440, a second CG circuit 450, and a second CS circuit 460. In general, the first CS circuit 430 is coupled with the first power supply port 401 to receive the high voltage (e.g., VDD). The first CG circuit 440 is coupled to the first CS circuit 430 to form a first CS-CG structure. Similarly, the second CS circuit 460 is coupled with the second power supply port 402 to receive the low voltage (e.g., VSS). The second CG circuit 450 is coupled to the second CS circuit 460 to form a second CS-CG structure that mirrors the first CS-CG structure.

The first CS circuit 430 includes a first CS transistor 431 and a second CS transistor 435, both of which are p-channel transistors (e.g., PMOS transistors). The first CS transistor 431 has a first CS source node 432, a first CS gate node 433, and a first CS drain node 434. The first CS gate node 433 is connected to a first input capacitor 421 with a configuration that enables the first gate node 433 to sense the first DRF signal 411. The first CS gate node 433 is connected to receive first bias voltage ($V_{B1}$) for conducting a first bias current ($I_{B1}$) from the first CS source node 432 to the first CG drain node 434.

The first CS transistor 431 defines a first CS transconductance ($G_{m\_cs1}$) based on the first bias current ($I_{B2}$) and according to Equations (1) and (2) as described above. Based on the first CS transconductance ($G_{m\_cs1}$), the first CS transistor 431 is configured to generate a first CS output current ($i_{cs1}$) according to Equation (3) as described above. The first CS drain node 434 is coupled with the first output lead 415, via a first summation node (N1) and a first output capacitor 425, to deliver the first CS output current ($i_{cs1}$).

The second CS transistor 435 has a second CS source node 436, a second CS gate node 437, and a second CS drain node 428. The second CS gate node 437 is connected to a second input capacitor 422 with a configuration that enables the second gate node 437 to sense the second DRF signal 412. The second CS gate node 437 is connected to receive the first bias voltage ($V_{B1}$) for conducting a second bias current ($I_{B2}$) from the second CS source node 436 to the second CS drain node 438.

The second CS transistor 435 defines a second CS transconductance ($G_{m\_cs2}$) based on the second bias current ($I_{B2}$) and according to Equations (1) and (2) as described above. Based by the second CS transconductance ($G_{m\_sc2}$), the second CS transistor 435 is configured to generate a second CS output current ($i_{cs2}$) according to Equation (3) as described above. The second CS drain node 436 is coupled with the second output lead 416, via a second summation node (N2) and a second output capacitor 426, to deliver the second CS output current ($i_{cs2}$).

The first CG circuit 440 includes a first CG transistor 441 and a second CG transistor 445, both of which are n-channel transistors (e.g., NMOS transistors). The first CG transistor 441 has a first CG drain node 442, a first CG gate node 443, and a first CG source node 444. The first CG gate node 443 is connected to receive a second bias voltage ($V_{B2}$) for conducting the first bias current ($I_{B1}$). The first CG transistor 441 receives the first bias current ($I_{B1}$) from the first CG drain node 442 and delivers it to the second CG circuit 450. The first CG transistor 441 defines a first CG transconductance ($G_{m\_cg1}$) based on the first bias current ($I_{B1}$) and according to Equations (4) and (5) as described above. The first CG source node 444 is coupled with the second RF input port 404 to receive a second input current ($I_{in2}$) driven by the second DRF signal 412. As described in Equation (6) above, the first CG transconductance ($G_{m\_cg1}$) matches with the input impedance in association with the second input current ($I_{in2}$).

The second input current ($I_{in2}$) establishes a second input voltage ($V_{in2}$) across the second CG circuit 450 and the second CS circuit 460. Based on the first CG transconductance ($G_{m\_cg1}$) and in response to the second input voltage ($V_{in2}$), the first CG transistor 441 is configured to generate a first CG output current ($i_{cg1}$) according to Equation (7) as described above. The first CG drain node 442 is coupled with the first output lead 415, via the first summation node (N1) and the first output capacitor 425, to deliver the first CG output current ($i_{cg1}$). The first CG output current ($i_{cg1}$) joins the first CS output current ($i_{cs1}$) at the first summation node (N1) to form the first top output current ($I_{O1\_T}$). According to Equation (9), the first top output current ($I_{O1\_T}$) is a summation function of the first CS transconductance ($G_{m\_cs1}$) and the first CG transconductance ($G_{m\_cg1}$).

The second CG transistor 445 has a second CG drain node 446, a second CG gate node 447, and a second CG source node 448. The second CG gate node 447 is connected to receive a second bias voltage ($V_{B2}$) for conducting the second bias current ($I_{B2}$). The second CG transistor 445 receives the second bias current ($I_{B2}$) from the second CG drain node 446 and delivers it to the second CG circuit 450. The second CG transistor 445 defines a second CG transconductance ($G_{m\_cg2}$) based on the second bias current ($I_{B2}$) and according to Equations (4) and (5) as described above. The second CG source node 448 is coupled with the first RF input port 403 to receive a first input current ($I_{in1}$) driven by the first DRF signal 411. As described in Equation (6) above, the second CG transconductance ($G_{m\_cg2}$) matches with the input impedance in association with the first input current ($I_{in1}$).

The first input current ($I_{in1}$) establishes a first input voltage ($V_{in1}$) across the second CG circuit 450 and the second CS circuit 460. Based on the second CG transconductance ($G_{m\_cg2}$) and in response to the first input voltage ($V_{in1}$), the second CG transistor 445 is configured to generate a second CG output current ($i_{cg2}$) according to Equation (7) as described above. The second CG drain node 446 is coupled with the second output lead 416, via the second summation node (N2) and the second output capacitor 426, to deliver the second CG output current ($i_{cg2}$). The second CG output current ($i_{cg2}$) joins the second CS output current ($i_{cs2}$) at the second summation node (N2) to form the second top output current ($I_{O2\_T}$). According to Equation (9), the second output current ($I_{O2\_T}$) is a summation function of the second CS transconductance ($G_{m\_cs2}$) and the second CG transconductance ($G_{m\_cg2}$).

The second CS circuit 460 includes a third CS transistor 461 and a fourth CS transistor 445, both of which are n-channel transistors (e.g., NMOS transistors). The third CS transistor 461 has a third CS drain node 462, a third CS gate node 463, and a third CS source node 464. The third CS gate node 463 is connected to a third input capacitor 423 with a configuration that enables the third gate node 463 to sense the first DRF signal 411. The third CS gate node 463 is connected to receive fourth bias voltage ($V_{B4}$) for conducting the first bias current ($I_{B1}$) from the third CS drain node 462 to the third CG source node 464.

The third CS transistor 461 defines a third CS transconductance ($G_{m\_cs3}$) based on the first bias current ($I_{B1}$) and according to Equations (1) and (2) as described above. Based on the third CS transconductance ($G_{m\_cs3}$), the third CS transistor 461 is configured to generate a third CS output current ($i_{cs3}$) according to Equation (3) as described above. The third CS drain node 462 is coupled with the first output lead 415, via a third summation node (N3) and a third output capacitor 427, to deliver the third CS output current ($i_{cs3}$).

The fourth CS transistor 465 has a fourth CS drain node 466, a fourth CS gate node 467, and a fourth CS source node 468. The fourth CS gate node 467 is connected to a fourth input capacitor 424 with a configuration that enables the fourth gate node 467 to sense the second DRF signal 412. The fourth CS gate node 467 is connected to receive the fourth bias voltage ($V_{B4}$) for conducting a second bias current ($I_{B2}$) from the fourth CS drain node 466 to the fourth CS source node 468.

The fourth CS transistor 465 defines a fourth CS transconductance ($G_{m\_cs4}$) based on the second bias current ($I_{B2}$) and according to Equations (1) and (2) as described above. Based by the fourth CS transconductance ($G_{m\_sc4}$), the fourth CS transistor 465 is configured to generate a fourth CS output current ($i_{cs4}$) according to Equation (3) as described above. The fourth CS drain node 466 is coupled with the second output lead 416, via a fourth summation node (N4) and a fourth output capacitor 428, to deliver the fourth CS output current ($i_{cs4}$).

The second CG circuit 450 includes a third CG transistor 451 and a fourth CG transistor 455, both of which are p-channel transistors (e.g., PMOS transistors). The third CG transistor 451 has a third CG source node 452, a third CG gate node 453, and a third CG drain node 454. The third CG gate node 453 is connected to receive a third bias voltage ($V_{B3}$) for conducting the first bias current ($I_{B1}$). The third CG transistor 451 receives the first bias current ($I_{B1}$) from the third CG source node 452 and delivers it to the second CS circuit 460. The third CG transistor 461 defines a third CG transconductance ($G_{m\_cg3}$) based on the first bias current ($I_{B1}$) and according to Equations (4) and (5) as described above. The third CG source node 452 is coupled with the second RF input port 404 to receive a second input current ($I_{in2}$) driven by the second DRF signal 412. As described in Equation (6) above, the third CG transconductance ($G_{m\_cg3}$) matches with the input impedance in association with the second input current ($I_{in2}$).

The second input current ($I_{in2}$) establishes a second input voltage ($V_{in2}$) across the second CG circuit 450 and the second CS circuit 460. Based on the third CG transconductance ($G_{m\_cg3}$) and in response to the second input voltage ($V_{in2}$), the third CG transistor 451 is configured to generate a third CG output current ($i_{cg3}$) according to Equation (7) as described above. The third CG drain node 454 is coupled with the first output lead 415, via the third summation node (N3) and the third output capacitor 427, to deliver the third CG output current ($i_{cg3}$). The third CG output current ($i_{cg3}$) joins the third CS output current ($i_{cs3}$) at the third summation node (N3) to form the first bottom output current ($I_{O1\_B}$).

According to Equation (9), the first bottom output current ($I_{O1\_B}$) is a summation function of the third CS transconductance ($G_{m\_cs3}$) and the third CG transconductance ($G_{m\_cg3}$).

The first bottom output current ($I_{O1\_B}$) joins the first top output current ($I_{O1\_T}$) at the first output lead 415 to form the first output current ($I_{O1}$). The first output current ($I_{O1}$) is a summation function of the first CS transconductance ($G_{m\_cs1}$), the first CG transconductance ($G_{m\_cg1}$), the third CS transconductance ($G_{m\_cs3}$), and the third CG transconductance ($G_{m\_cg3}$).

The fourth CG transistor 455 has a fourth CG source node 456, a fourth CG gate node 457, and a fourth CG drain node 458. The fourth CG gate node 457 is connected to receive a third bias voltage ($V_{B3}$) for conducting the second bias current ($I_{B2}$). The fourth CG transistor 455 receives the second bias current ($I_{B2}$) from the fourth CG source node 456 and delivers it to the second CS circuit 460. The fourth CG transistor 455 defines a fourth CG transconductance ($G_{m\_cg4}$) based on the second bias current ($I_{B2}$) and according to Equations (4) and (5) as described above. The fourth CG source node 456 is coupled with the first RF input port 403 to receive a first input current ($I_{in1}$) driven by the first DRF signal 411. As described in Equation (6) above, the fourth CG transconductance ($G_{m\_cG4}$) matches with the input impedance in association with the first input current ($I_{in1}$).

The first input current ($I_{in1}$) establishes a first input voltage ($V_{in1}$) across the second CG circuit 450 and the second CS circuit 460. Based on the fourth CG transconductance ($G_{m\_cg4}$) and in response to the first input voltage ($V_{in1}$), the fourth CG transistor 455 is configured to generate a fourth CG output current ($i_{cg4}$) according to Equation (7) as described above. The fourth CG drain node 458 is coupled with the second output lead 416, via the fourth summation node (N4) and the fourth output capacitor 428, to deliver the fourth CG output current ($i_{cg4}$). The fourth CG output current ($i_{cg4}$) joins the fourth CS output current ($i_{cs4}$) at the fourth summation node (N4) to form the second bottom output current ($I_{O2\_B}$).

According to Equation (9), the second bottom output current ($I_{O2\_B}$) is a summation function of the fourth CS transconductance ($G_{m\_cs4}$) and the fourth CG transconductance ($G_{m\_cs4}$). The second bottom output current ($I_{O2\_B}$) joins the second top output current ($I_{O2\_T}$) at the second output lead 416 to form the second output current ($I_{O2}$). The second output current ($I_{O2}$) is a summation function of the second CS transconductance ($G_{m\_cs2}$), the second CG transconductance ($G_{m\_cg2}$), the fourth CS transconductance ($G_{m\_cs4}$), and the fourth CG transconductance ($G_{m\_cg4}$).

Like the DMA 300, the DMA 400 includes a first current path and a second path. The first current path conducts the first bias current ($I_{B1}$) through the first CS transistor 431, the first CG transistor 441, the third CG transistor 451, and the third CS transistor 461. The first current path implements a double CS-CG architecture to increase the total gain of the CS-CG architecture as described in FIG. 2. With this double CG-CG architecture, the first current path of the DMA 400 advantageously breaks free from the tradeoff between input impedance matching and gain boosting. On the one hand, the first CG transistor 431 and the third CG transistor 451 collectively provide the input impedance matching associated with the second input current ($I_{in2}$), as well as a moderate gain based on the first CG transconductance ($G_{m\_cg1}$) and the third CG transconductance ($G_{m\_cg3}$).

And on the other hand, the first CS transistor 431 and the third CS transistor 461 collectively provide additional gain boost based on the first CS transconductance ($G_{m\_cs1}$) and the third CS transconductance ($G_{m\_cs3}$), which are generally independent of the input impedance associated with the second input current ($I_{in2}$). This CS gain boost doubles that of the first current in the DMA 300 as described in FIG. 3 provided that the potential difference between the first and second power supply ports 401 and 402 is sufficiently large to sustain the operations of four serially connected transistors. Moreover, because the first and third CS transistors 431 and 451, as well as the first and third CG transistor 441 and 451, share the same first bias current ($I_{B1}$), the first current path of the DMA 400 is power efficient and less susceptible to noise.

The second current path conducts the second bias current ($I_{B1}$) through the second CS transistor 435, the second CG transistor 445, the fourth CG transistor 455, and the fourth CS transistor 465. The second current path implements a double CS-CG architecture to increase the total gain of the CS-CG architecture as described in FIG. 2. With this double CG-CG architecture, the second current path of the DMA 400 advantageously breaks free from the tradeoff between input impedance matching and gain boosting. On the one hand, the second CG transistor 435 and the fourth CG transistor 455 collectively provide the input impedance matching associated with the first input current ($I_{in1}$), as well as a moderate gain based on the second CG transconductance ($G_{m\_cg2}$) and the fourth CG transconductance ($G_{m\_cg4}$).

And on the other hand, the second CS transistor 435 and the fourth CS transistor 465 collectively provide additional gain boost based on the second CS transconductance ($G_{m\_cs2}$) and the fourth CS transconductance ($G_{m\_cs4}$), which are generally independent of the input impedance associated with the first input current ($I_{in1}$). This CS gain boost doubles that of the second current in the DMA 300 as described in FIG. 3 provided that the potential difference between the first and second power supply ports 401 and 402 is sufficiently large to sustain the operations of four serially connected transistors. Moreover, because the second and fourth CS transistors 435 and 455, as well as the second and fourth CG transistor 445 and 455, share the same second bias current ($I_{B2}$), the first current path of the DMA 400 is power efficient and less susceptible to noise.

Figure 5:
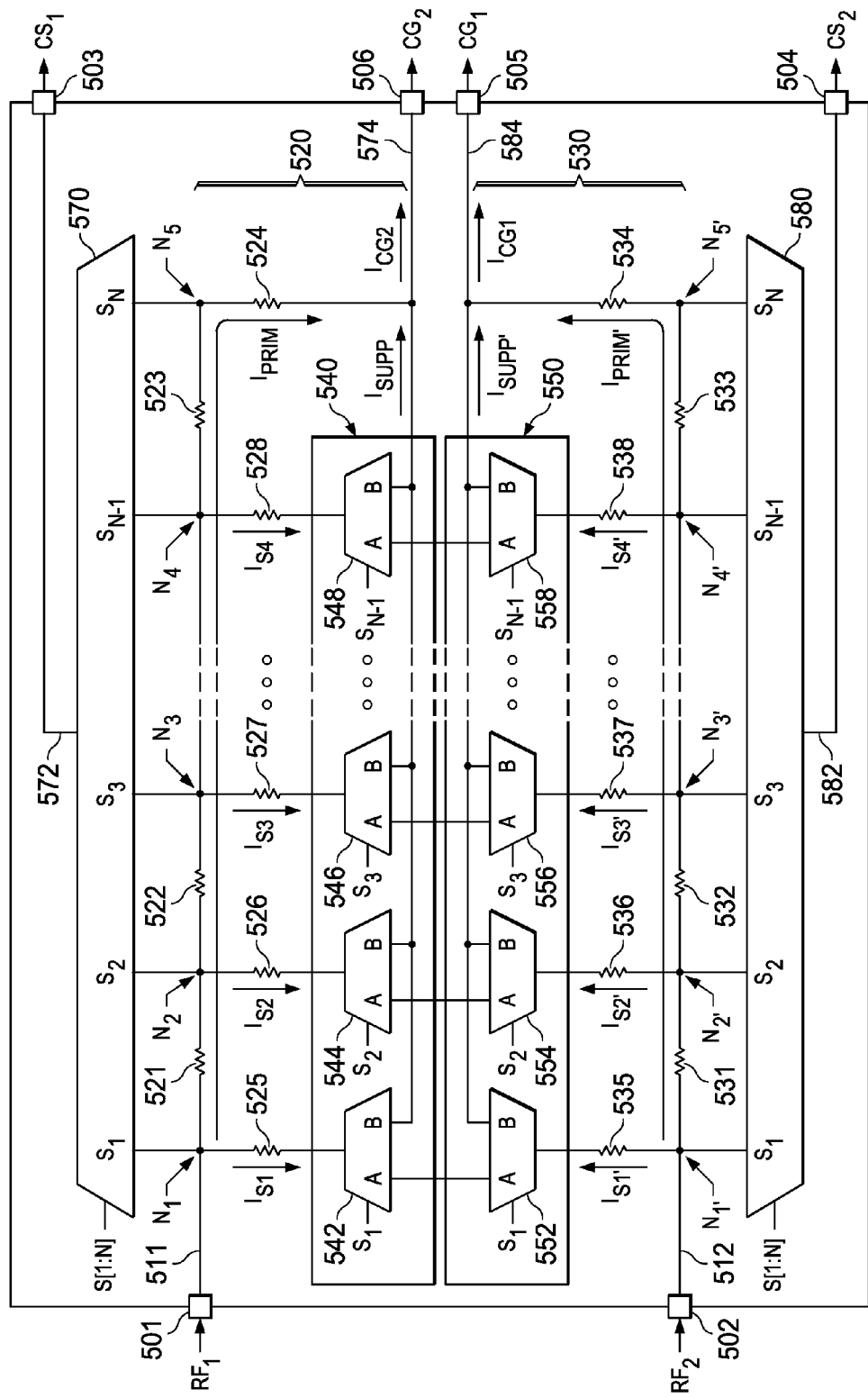
FIG. 5 shows a schematic view of an attenuation circuit according to an aspect of the present disclosure.

FIG. 5 shows a schematic view of an attenuation circuit 500 according to an aspect of the present disclosure. The attenuation circuit 500 can be used for adjusting the overall gain of a matching amplifier (e.g., the matching amplifier 200, the DMA 300, and/or the DMA 400) by controlling the input current being supplied to the common-gate (CG) circuit (e.g., the CG circuit 220, the CG circuit 370, the first CG circuit 440, and/or the second CG circuit 450). Assuming that the input voltage is proportional to the input current, the CG circuit gain is proportional to the input current according to the descriptions of Equations (6) and (7). Thus, a larger input current enables the CG circuit to produce a larger gain, whereas a smaller input current suppresses the CG circuit to produce a smaller gain.

The attenuation circuit 500 serves as a means for adjusting the input current to the matching amplifier by providing a fixed primary current and an adjustable supplementary current. The attenuation circuit 500 can be inserted between the input ports (e.g., the RF input ports) of the matching amplifier and the input nodes of the amplifying transistors (e.g., the gate nodes of the CS transistors and the source nodes of the CG transistors). More specifically, the periphery of the attenuation circuit includes a first RF input port 501, a second RF input port 502, a first CS output port 503, a second CS output port 504, a first CG output port 505, and a second CG output port 506.

Referring to the DMA 300 as an example, the first RF input port 501 may be connected to the first input port 303 for receiving the first DRF signal 511, whereas the second RF input ort 502 may be connected to the second input port 304 for receiving the second DRF signal 512. For interfacing with the CS circuit, such as the CS circuit 330, the first CS output port 503 may be coupled with the first CS gate terminal 333 via the first input capacitor 313; whereas the second CS output port 504 may be coupled with the second CS gate terminal 343 via the second input capacitor 314. And for interfacing with the CG circuit, such as the CG circuit 370, the first CG output port 505 may be connected to the first CG source node 374 for providing the second input current ($I_{in2}$); whereas the second CG output port 506 may be connected to the second source node 384 for providing the first input current ($I_{in1}$).

The interior of the attenuation circuit 500 includes a first adjustable resistor network 520, a second adjustable resistor network 530, a first switching circuit 540, a second switching circuit 550, a first CS input switch 570, and a second CS input switch 580. The first adjustable resistor network 520 includes a fixed resistive path (i.e., a first resistor chain) for conducting a primary current ($I_{PRIM}$) and an adjustable resistive path (i.e., a second resistor chain) for conducting a supplementary current ($I_{SUPP}$). The fixed resistive path includes a first primary resistor 521, a second primary resistor 522, a third primary resistor 523, and a fourth primary resistor 524. The first primary resistor 521 is connected to the first RF input port 501 via a first node (N1). The second primary resistor 522 is connected in series with the first primary resistor 521 via a second node (N2). The third primary resistor 523 is connected in series with the second primary resistor 522 via a third node (N3), a fourth node (N4), and one or more additional primary resistors connected in series between the third node (N3) and the fourth node (N4). The fourth primary resistor 524 is connected in series with the third primary resistor 523 via a fifth node (N5).

The adjustable resistive path includes one or more supplementary resistors connected in parallel and selectable by the first switching circuit 540. The adjustable resistive path includes a first supplementary resistor 525, a second supplementary resistor 526, a third supplementary resistor 527, and a fourth supplementary resistor 528. The first switching circuit 540 includes one or more multiplexers (MUX), each of which is dedicated to one supplementary resistor. In one implementation, for example, the first switching circuit 540 includes a first MUX 542, a second MUX 544, a third MUX 546, and a fourth MUX 548.

When a first selection signal (S1) is enabled, the first MUX 542 selects the first supplementary resistor 525 to conduct a first supplementary current ($I_{S1}$) via one of its input port (e.g., port B). In contrary, when the first selection signal (S1) is disabled, the first MUX 542 decouples the first supplementary resistor 525 from the second CG output port 506. When a second selection signal (S2) is enabled, the second MUX 544 selects the second supplementary resistor 526 to conduct a second supplementary current ($I_{S2}$). In contrary, when the second selection signal (S2) is disabled, the second MUX 544 decouples the second supplementary resistor 526 from the second CG output port 506. When a third selection signal (S3) is enabled, the third MUX 546 selects the third supplementary resistor 527 to conduct a third supplementary current ($I_{S3}$). In contrary, when the third selection signal (S3) is disabled, the third MUX 546 decouples the third supplementary resistor 527 from the second CG output port 506. When a fourth selection signal (S4) is enabled, the fourth MUX 548 selects the fourth supplementary resistor 528 to conduct a fourth supplementary current ($I_{S4}$). In contrary, when the fourth selection signal (S4) is disabled, the fourth MUX 548 decouples the fourth supplementary resistor 528 from the second CG output port 506.

Each of the first, second, third, and fourth supplementary currents ($I_{S1}$, $I_{S2}$, $I_{S3}$, $I_{S4}$) is added to the primary current ($I_{PRIM}$) to augment the second CG input current ($I_{CG2}$). The second CG input current ($I_{CG2}$) is a part of a second CG differential RF signal 574 for delivery to the second CG output port 506. The first MUX 542, second MUX 544, third MUX 546, and fourth MUX 548 can be simultaneously enabled. Thus, the maximum second CG input current ($I_{CG2}$) is the sum of the primary current ($I_{PRIM}$) and the maximum supplementary current ($I_{SUPP}$). The maximum supplementary current ($I_{SUPP}$) can be defined as the sum of the first, second, third, and fourth supplementary currents ($I_{S1}$, $I_{S2}$, $I_{S3}$, $I_{S4}$). Also, the first MUX 542, second MUX 544, third MUX 546, and fourth MUX 548 can be simultaneously disabled. Thus, the minimum second CG input current ($I_{CG2}$) is the primary current ($I_{PRIM}$) with the supplementary current ($I_{SUPP}$) equals zero.

The first CS input switch 570 serves as a phase matching means for matching the selection made by the first switching circuit 540. As a default, the first CS input switch 570 selects the fifth node (N5) to provide a first CS differential RF signal 572. When the first selection signal (S1) is enabled, the first CS input switch 570 adds the signal carried by the first node (N1) to the first CS differential RF signal 572. When the second selection signal (S2) is enabled, the first CS input switch 570 adds the signal carried by the second node (N2) to the first CS differential RF signal 572. When the third selection signal (S3) is enabled, the first CS input switch 570 adds the signal carried by the third node (N3) to the first CS differential RF signal 572. When the fourth selection signal (S4) is enabled, the first CS input switch 570 adds the signal carried by the fourth node (N4) to the first CS differential RF signal 572.

The second adjustable resistor network 530 includes a fixed resistive path (i.e., a first resistor chain) for conducting a primary current ($I_{PRIM}'$) and an adjustable resistive path (i.e., a second resistor chain) for conducting a supplementary current ($I_{SUPP}'$). The fixed resistive path includes a first primary resistor 531, a second primary resistor 532, a third primary resistor 533, and a fourth primary resistor 534. The first primary resistor 531 is connected to the second RF input port 502 via a first node (N1'). The second primary resistor 532 is connected in series with the first primary resistor 531 via a second node (N2'). The third primary resistor 533 is connected in series with the second primary resistor 532 via a third node (N3'), a fourth node (N4'), and one or more additional primary resistors connected in series between the third node (N3') and the fourth node (N4'). The fourth primary resistor 534 is connected in series with the third primary resistor 533 via a fifth node (N5').

The adjustable resistive path includes one or more supplementary resistors connected in parallel and selectable by the second switching circuit 550. The adjustable resistive path includes a first supplementary resistor 535, a second supplementary resistor 536, a third supplementary resistor 537, and a fourth supplementary resistor 538. The second switching circuit 550 includes one or more multiplexers (MUX), each of which is dedicated to one supplementary resistor. In one implementation, for example, the second switching circuit 550 includes a first MUX 552, a second MUX 554, a third MUX 556, and a fourth MUX 558.

When a first selection signal (S1) is enabled, the first MUX 552 selects the first supplementary resistor 535 to conduct a first supplementary current ($I_{S1}'$) via one of its input port (e.g., port B). In contrary, when the first selection signal (S1) is disabled, the first MUX 552 decouples the first supplementary resistor 535 from the first CG output port 505. When a second selection signal (S2) is enabled, the second MUX 554 selects the second supplementary resistor 536 to conduct a second supplementary current ($I_{S2}'$). In contrary, when the second selection signal (S2) is disabled, the second MUX 554 decouples the second supplementary resistor 536 from the first CG output port 505. When a third selection signal (S3) is enabled, the third MUX 556 selects the third supplementary resistor 537 to conduct a third supplementary current ($I_{S3}'$). In contrary, when the third selection signal (S3) is disabled, the third MUX 556 decouples the third supplementary resistor 537 from the first CG output port 505. When a fourth selection signal (S4) is enabled, the fourth MUX 558 selects the fourth supplementary resistor 538 to conduct a fourth supplementary current ($I_{S4}'$). In contrary, when the fourth selection signal (S4) is disabled, the fourth MUX 558 decouples the fourth supplementary resistor 538 from the first CG output port 505.

Each of the first, second, third, and fourth supplementary currents ($I_{S1}'$, $I_{S2}'$, $I_{S3}'$, $I_{S4}'$) is added to the primary current ($I_{PRIM}'$) to augment the first CG input current ($I_{CG1}$). The first CG input current ($I_{CG1}$) is a part of a first CG differential RF signal 584 for delivery to the first CG output port 505. The first MUX 552, second MUX 554, third MUX 556, and fourth MUX 558 can be simultaneously enabled. Thus, the maximum first CG input current ($I_{CG1}$) is the sum of the primary current ($I_{PRIM}'$) and the maximum supplementary current ($I_{SUPP}'$). The maximum supplementary current ($I_{SUPP}'$) can be defined as the sum of the first, second, third, and fourth supplementary currents ($I_{S1}'$, $I_{S2}'$, $I_{S3}'$, $I_{S4}'$). Also, the first MUX 552, second MUX 554, third MUX 556, and fourth MUX 558 can be simultaneously disabled. Thus, the minimum first CG input current ($I_{CG1}$) is the primary current ($I_{PRIM}'$) with the supplementary current ($I_{SUPP}'$) equals zero.

The second CS input switch 570 serves as a phase matching means for matching the selection made by the second switching circuit 550. As a default, the second CS input switch 580 selects the fifth node (N5') to provide a second CS differential RF signal 582. When the first selection signal (S1) is enabled, the second CS input switch 580 adds the signal carried by the first node (N1) to the second CS differential RF signal 582. When the second selection signal (S2) is enabled, the second CS input switch 580 adds the signal carried by the second node (N2) to the second CS differential RF signal 582. When the third selection signal (S3) is enabled, the second CS input switch 580 adds the signal carried by the third node (N3) to the second CS differential RF signal 582. When the fourth selection signal (S4) is enabled, the second CS input switch 580 adds the signal carried by the fourth node (N4) to the second CS differential RF signal 582.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the methods and/or operations described (such as a program encoded in a computer-readable medium, which can be a memory device, a storage device, a machine-readable storage substrate, or other physical, machine-readable medium, or a combination of one or more of them).

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit comprising:
    an input port configured to receive a radio frequency (RF) signal; and
    an amplifier coupled with the input port, the amplifier including:
        a common-source (CS) circuit having a gate terminal coupled with the input port, the CS circuit defining a first transconductance based on a bias current;
        a common-gate (CG) circuit having a drain terminal coupled with the CS circuit and a source terminal coupled with the input port, the CG circuit defining a second transconductance based on the bias current to match an input impedance associated with the RF signal; and
        an output lead coupled with the CS circuit and the CG circuit, and the output lead configured to deliver an output current.

2. The integrated circuit of claim 1, wherein the output current is based on a sum of the first transconductance and the second transconductance.

3. The integrated circuit of claim 1, wherein the CG circuit maintains the second transconductance at approximately one-fiftieth of an ohm over a broadband frequency range of the RF signal.

4. The integrated circuit of claim 1, further comprising:
    a cascode circuit coupled between a drain terminal of the CS circuit and the drain terminal of the CG circuit.

5. The integrated circuit of claim 1, further comprising:
    a source bias circuit coupled to the source terminal of the CG circuit, the source bias circuit configured to conduct the bias current shared by the CS circuit and the CG circuit.

6. The integrated circuit of claim 1, wherein:
the RF signal includes a first differential signal and a second differential signal having an opposite polarity from the first differential signal;
the gate terminal of the CS circuit is coupled with the first differential signal; and
the source terminal of the CG circuit is coupled with the second differential signal.

7. The integrated circuit of claim 1, wherein:
the RF signal includes a first differential signal and a second differential signal having an opposite polarity from the first differential signal;
the CS circuit includes a first CS transistor having a first CS gate node coupled with the first differential signal; and
the CG circuit includes a first CG transistor having a first CG source node coupled with the second differential signal.

8. The integrated circuit of claim 7, wherein:
the CS circuit includes a second CS transistor having a second CS gate node coupled with the second differential signal; and
the CG circuit includes a second CG transistor having a second CG source node coupled with the first differential signal.

9. The integrated circuit of claim 1, further comprising:
an attenuation circuit coupled between the input port and the source terminal of the CG circuit, the attenuation circuit including an adjustable resistor network configured to deliver an input current to the source terminal of the CG circuit.

10. The integrated circuit of claim 9, wherein the adjustable resistor network includes
a first resistor chain configured to conduct a primary current of the input current; and
a second resistor chain diverting from the first resistor chain, and upon being selected, the second resistor chain configured to conduct a supplementary current for supplementing the first input current.

11. An amplifier for use in a radio frequency (RF) receiver configured to receive an RF signal, the amplifier comprising:
a first common-source (CS) transistor having a first CS gate node configured to sense a first differential signal of the RF signal;
a first common-gate (CG) transistor having:
a first CG drain node coupled with the first CS transistor; and
a first CG source node configured to receive a first input current driven by a second differential signal of the RF signal, the second differential signal has an opposite polarity from the first differential signal;
a second CS transistor having a second CS gate node configured to sense the second differential signal of the RF signal; and
a second CG transistor having:
a second CG drain node coupled with the second CS transistor; and
a second CG source node configured to receive a second input current driven by the first differential signal of the RF signal.

12. The amplifier of claim 11, wherein the first CG transistor and the second CG transistor each maintains a CG transconductance at approximately one-fiftieth of an ohm over a broadband frequency range of the RF signal.

13. The amplifier of claim 11, wherein:
the first CS transistor and the first CG transistor are configured to share a first bias current, the first CG transistor defines a first CG transconductance based on the first bias current, and the first CS transistor defines a first CS transconductance based on the first bias current;
the first CS transistor and the first CG transistor are configured to deliver a first output current based on the first CG transconductance and the first CS transconductance;
the second CS transistor and the second CG transistor are configured to share a second bias current, the second CG transistor defines a second CG transconductance based on the second bias current, and the first CS transistor defines a second CS transconductance based on the second bias current; and
the second CS transistor and the second CG transistor are configured to deliver a second output current based on the second CG transconductance and the second CS transconductance.

14. The amplifier of claim 11, further comprising:
a first cascode transistor coupled between a first CS drain node of the first CS transistor and the first CG drain node of the first CG transistor; and
a second cascode transistor coupled between a second CS drain node of the second CS transistor and the second CG drain node of the second CG transistor.

15. The amplifier of claim 11, further comprising:
a first bias resistor coupled to the first CG source node of the first CG transistor, the first bias resistor is configured to conduct a first bias current passing through the first CS transistor and the first CG transistor; and
a second bias resistor coupled to the second CG source node of the second CG transistor, the second bias resistor is configured to conduct a second bias current passing through the second CS transistor and the second CG transistor.

16. A front-end (FE) receiver comprising:
an antenna configured to receive a radio frequency (RF) signal; and
an amplifier coupled with the antenna, the amplifier including:
a common-source (CS) circuit defining a first transconductance based on a bias current; and
a common-gate (CG) circuit coupled with the CS circuit and defining a second transconductance based on the bias current to match an input impedance associated with the RF signal; and
an output lead coupled with the CS circuit and the CG circuit and configured to deliver an output current based on a sum of the first transconductance and the second transconductance.

17. The FE receiver of claim 16, wherein the CG circuit maintains the second transconductance at approximately one-fiftieth of an ohm over a broadband frequency range of the RF signal.

18. The FE receiver of claim 16, wherein:
the RF signal includes a first differential signal and a second differential signal having an opposite polarity from the first differential signal;
the CS circuit includes:
a first CS transistor having a first CS gate node coupled with the first differential signal via a first capacitor; and
a second CS transistor having a second CS gate node coupled with the second differential signal via a second capacitor; and
the CG circuit includes:
a first CG transistor having a first CG source node coupled with the second differential signal; and
a second CG transistor having a second CG source node coupled with the first differential signal.

19. The FE receiver of claim 16, further comprising:
an attenuation circuit coupled between the antenna and the CG circuit, the attenuation circuit including an adjustable resistor network configured to deliver an input current to the CG circuit.

20. The FE receiver of claim 16, wherein the adjustable resistor network includes
a first resistor chain configured to conduct a primary current of the input current; and
a second resistor chain diverting from the first resistor chain, and upon being selected, the second resistor chain configured to conduct a supplementary current for supplementing the first input current.

* * * * *